United States Patent [19]
Eastman

[11] Patent Number: 4,649,405
[45] Date of Patent: Mar. 10, 1987

[54] ELECTRON BALLISTIC INJECTION AND EXTRACTION FOR VERY HIGH EFFICIENCY, HIGH FREQUENCY TRANSFERRED ELECTRON DEVICES

[75] Inventor: Lester F. Eastman, Ithaca, N.Y.

[73] Assignee: Cornell Research Foundation, Inc., Ithaca, N.Y.

[21] Appl. No.: 598,755

[22] Filed: Apr. 10, 1984

[51] Int. Cl.[4] .................... H01L 29/88; H01L 29/20; H01L 29/86
[52] U.S. Cl. ........................................ 357/3; 357/16; 357/89
[58] Field of Search ........................................ 357/3, 16

[56] References Cited

U.S. PATENT DOCUMENTS

| | | | |
|---|---|---|---|
| 3,209,215 | 9/1965 | Esaki | 317/234 |
| 3,211,970 | 10/1965 | Christian | 317/235 |
| 3,467,896 | 9/1969 | Kroemer | 357/3 |
| 3,488,512 | 1/1970 | Lehrer et al. | 313/108 |
| 3,946,336 | 3/1976 | Froom et al. | 357/3 |
| 3,986,192 | 10/1976 | DiLorenzo et al. | 357/12 |
| 4,119,994 | 10/1978 | Jain et al. | 357/16 |
| 4,173,763 | 11/1979 | Chang et al. | 357/12 |
| 4,286,275 | 8/1981 | Heiblum | 357/12 |
| 4,366,493 | 12/1982 | Braslau et al. | 357/4 |
| 4,395,722 | 7/1983 | Esaki et al. | 357/16 |
| 4,417,261 | 11/1983 | Gray et al. | 357/3 |
| 4,482,910 | 11/1984 | Nishizawa et al. | 357/34 |
| 4,539,581 | 9/1985 | Malik et al. | 357/3 |

OTHER PUBLICATIONS

Esposito et al., "Oscillator", *IBM Tech. Discl. Bull.*, vol. 12, No. 11, Apr. 1970, pp. 1755–1756.
"GaAlAs–GaAs Ballistic Heterojunction Bipolar Transistor", 8/19/72, *Electronics Letters*, vol. 18, No. 17.
"Heterostructure Bipolar Transistors and Integrated Circuits", Jan. 1982, vol. 70, No. 1, Herbert Kroemer, *Proceedings of the IEEE*.
"Heterostructure Long Lifetime Hot Electron Transistor", W. P. Dumke et al., Dec. 1981, V.24, No. 7A, pp. 3229–3231, *IBM Technical Disclosure Bulletin*.
"Graded Bandgap Heterojunction Bipolar Transistor", H. J. Hovel, Jan. 1980, V.22, No. 8B, p. 3875, *IBM Technical Disclosure Bulletin*.

*Primary Examiner*—Martin H. Edlow
*Assistant Examiner*—Charles S. Small, Jr.
*Attorney, Agent, or Firm*—Jones, Tullar & Cooper

[57] ABSTRACT

A high frequency transferred electron device having electron ballistic injection and extraction for very high efficiency is disclosed. The device comprises a semiconductor body having at least two electrodes with a thin barrier layer being formed at one electrode for launching ballistic electrons at a controlled kinetic energy into the body. The body includes a drift region having a low, controlled density of electrons and impurities. A second heavily doped (N+) collector semiconductor layer at the second electrode insures that there is no barrier at the second electrode interface, thereby allowing energetic electrons to be removed from the drift region and allowing entry of new ballistic electrons to improve the efficiency and frequency response of the device.

16 Claims, 7 Drawing Figures

ELECTRON BALLISTIC INJECTION AND EXTRACTION FOR VERY HIGH EFFICIENCY, HIGH FREQUENCY TRANSFERRED ELECTRON DEVICES

BACKGROUND OF THE INVENTION

This invention arose out of research sponsored by the U. S. Department of the Air Force, under Contract No. F49620-81-C-0082.

The present invention relates, in general, to high frequency semiconductor devices operating in the upper microwave frequencies. More particularly, the invention is directed to a transferred electron device which utilizes ballistic phenomena to obtain improved efficiency and higher frequency operation than has previously been available.

Considerable work has been done in recent years to develop semiconductor devices capable of operating at extremely high frequencies. In the past, semiconductor devices generally were limited in their frequency response by reason of the fact that charge carriers, on which current load depends, encounter collisions in the semiconductor material. Those difficulties have been overcome to a large extent by the development of a class of devices wherein the charge carriers can move from one electrode to another essentially without such collisions so that the carrier velocity in the device is a direct function of the applied voltage, and thus can be at or near its theoretical maximum. Such devices are known in the art as ballistic transport devices. U.S. Pat. No. 4,366,493 to Norman Braslau et al and the references discussed therein are examples of such devices.

As set forth in the Braslau et al patent, the ballistic transport of charge carriers within a semiconductor body can occur only when a number of stringent criteria concerning the structure and the operating conditions of the device are met. Thus, the semiconductor body must be of such a material that significant energy and momentum reducing collisions do not take place in the body within the distance over which the ballistic transport is to take place. Further, the distance in the semiconductor body between ohmic electrodes must be greater than that which will permit quantum mechanical tunneling, and must be of the order of the mean-free path of the semiconductor material chosen for the body. Finally, since collisions can occur with doped impurities, the doping level in the body, which also affects the mean-free path length, must be below the region where the probability of collisions is increased, yet there should be enough impurities to provide a practical current in the device.

Collisions can also occur between charge carriers and the crystal lattice of the semiconductor material. One type of lattice collision involves an intervalley carrier transition where the effect is a transfer of the carrier from a low mass to a high mass condition. This is know as the Gunn effect. In order to obtain ballistic transport, according to the Braslau et al patent, the impressed voltage across the semiconductor body must be less than that which would produce an intervalley carrier transition. The existence of the Gunn effect therefore places a further restriction on the available operating voltage for ballistic transport, limiting the voltage to the energy gap between the condution band and the nearest minimum energy valley for the semiconductor material. For a material such as gallium arsenide (GaAs) the available operating voltage is of the order of 0.3–0.4 electron volts. Since this operating voltage is so small, additional restrictions are placed on the construction of a ballistic transport device; thus, the ohmic external electrodes must have a very low resistance so as to avoid dissipation of a significant portion of the available signal. The Braslau et al patent is directed to the construction of a ballistic transport device meeting these criteria.

The Braslau et al device utilizes a semiconductor body the width of which is such that quantum mechanical tunnelling cannot take place; that is, the width is greater than about 100 Angstroms for gallium arsenide. The mean-free path in gallium arsenide is less than about 5000 Angstroms (0.5 microns) so the Braslau et al device preferably has a width of between about 2000 and 4000 Angstroms. The doping level in this body is greater than $10^{14}$ atoms/cm$^3$ for good conductivity, but less than $10^{16}$ atoms/cm$^3$ to prevent impurity collisions. In such a device, an impressed voltage on the order of 0.3 volts will produce a field across the width of the semiconductor body which is insufficient to produce intervalley transitions of the carriers resulting from collisions with the crystal lattice of the body.

In contrast with such a construction are the Gunn type devices which depend on electron transfers to lower electron velocity at higher voltages. In Gunn type devices where the body is gallium arsenide, the impressed voltage must be greater than 0.3 volts so as to produce carrier intervalley transitions which transfer the carriers from a low mass condition to a high mass condition. This contrasts with the ballistic type device wherein the charge carriers are always in the low mass condition. A typical Gunn type device using gallium arsenide will have a width on the order of 100 microns and will have a doping density of less than $1 \times 10^{16}$ atoms/cm$^3$.

Because of their thickness and the transfer of their charge carriers between high and low mass conditions, Gunn devices have a limited frequency response and are limited to about a 16% efficiency. Ballistic transport devices, on the other hand, operate at a low mass condition and thus are capable of a higher frequency response, but because the voltage must be kept low, they have a limited power capacity.

SUMMARY OF THE INVENTION

The present invention is directed to an improved high frequency semiconductor device which provides oscillation efficiencies on the order of up to 2.5 times higher than those previously available for high frequency devices operating in the microwave range. Such high performance oscillation is accomplished in a device which is a combination of both ballistic and Gunn effects. The device utilizes high energy ballistic electrons in combination with electron transfer between low mass and high mass conditions, the device providing an improved effective relaxation time which results in an increase in the frequency response by a factor of up to about 2.5 over prior high frequency electron transferred devices.

The improved operation is accomplished in accordance with the present invention through the provision of a short two-electrode semiconductor device having a barrier layer formed between the semiconductor body and a first electrode. This barrier layer serves to launch ballistic electrons at controlled kinetic energies into the semiconductor body, the body including a drift region having a low, controlled density of electrons and impurities. No barrier is present at the second or collector electrode, thereby allowing energetic electrons to be extracted from the drift region, and allowing the entry of new ballistic electrons moving in the same direction.

The drift region of the semiconductor device is sufficiently thin (between about 0.6 and 1.0 microns) that ballistic electrons injected into the drift region can travel the entire width thereof nearly ballistically during a low voltage (e.g., 0.4 V) portion of an oscillating signal applied across the electrodes. During the high voltage (e.g., 0.8 V) portion of the oscillating signal, the electrons injected into the drift region are affected by a voltage higher than that required for ballistic travel, and some undergo a transfer to a high mass state, in accordance with the Gunn effect. Electrons which experience such a transfer have an adverse effect on the frequency response capabilities and the current carrying capabilities of conventional transferred electron devices. Further, in conventional Gunn effect devices using GaAs about 7 picoseconds total are required for the effective transfer of electrons back from the high mass condition to the low mass condition and for electron energy relaxation, after the applied voltage has been returned to its low voltage level. This transfer time and the time needed for relaxation of electronic energy provides a further limit on the frequency response of such devices.

It has been found, however, that by having no barrier at the second electrode interface, energetic electrons are extracted from the drift region. This allows the high velocity ballistic electrons to move out of the drift region as the oscillation cycle returns to a low value and allows a transfer of higher mass electrons back to their lower mass states. Although the electrons transferred back to their low mass states move ballistically in any direction within the drift region, the existence of a small, finite instantaneous electrical field across the device due to the applied oscillating signal causes the transferred low mass electrons to tend to move toward the second electrode and out of the device. Thus, the provision of no barrier at the second, or collector electrode enhances the extraction of electrons from the device and provides a net reduction in the effective relaxation time of the entire device from 7 picoseconds to about 2.6 picoseconds.

The reduction in the effective relaxation time of the device of the present invention provides a substantial increase in the frequency response so that instead of having the efficiency halved at 50 gHz, as in an ordinary microwave frequency transferred electron devices, the efficiency will be halved at about a 125 gHz. The structure of the present device also results in increased efficiency for transferred electron devices. Efficiency is dependent on the ratio of peak currents to valley currents. This ratio is, in turn, dependent on the peak-to-valley ratio of the velocity of average electrons. Since ballistic electrons move at a high velocity (up to $1 \times 10^8$ cm/s) the average velocity in the device of the present invention is substantially increased over that which is available in ordinary transferred electron devices, which have a relatively low velocity (about $1 \times 10^7$ cm/s). The result is an increase in overall electronic efficiency from the 16% available in ordinary transferred electron devices up to about 40%.

It will be seen from the foregoing, therefore, that the present invention provides a semiconductor device which is an improvement over conventional transferred (Gunn effect) electron devices since it provides better efficiency, while at the same time providing higher operating frequency.

BRIEF DESCRIPTION OF DRAWINGS

The foregoing and additional objects, features and advantages of the present invention will become apparent to those of skill in the art from a consideration of the following detailed description of preferred embodiments thereof, taken in conjunction with the accompanying drawings, in which.

DESCRIPTION OF PREFERRED EMBODIMENTS

Figure 1:
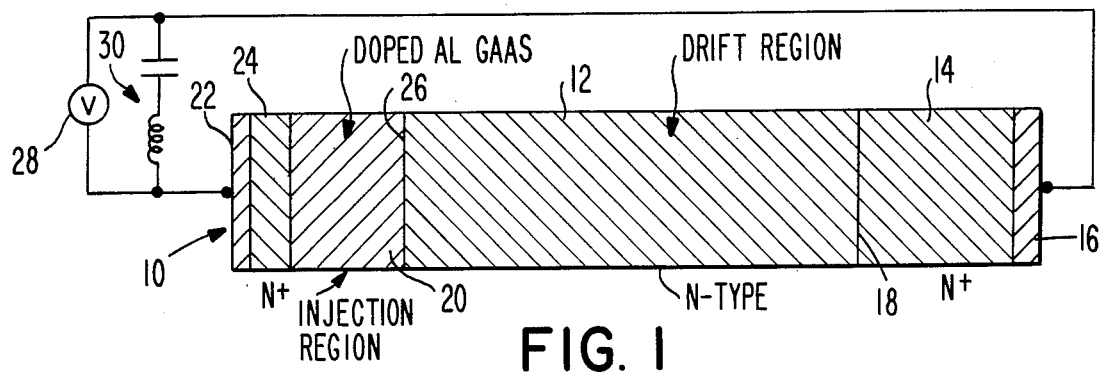
FIG. 1 is a diagrammatic illustration of a heterojunction semiconductor device constructed in accordance with the present invention.

Turning now to a more detailed description of the present invention, there is illustrated at 10 a compound semiconductor device so constructed as to produce and maintain a very high (up to $1 \times 10^8$ cm/s) electron velocity across a substantial thickness, in the range of 0.6 and 1.0 micron for gallium arsenide, at a low voltage of about 0.2 to 0.4 volts. The device is further capable of producing the low electron velocity (about $1 \times 10^7$ cm/s) commonly produced in transferred electron devices as a result of the transfer of electrons to a high mass condition at voltage levels several times the voltage which produces high electron velocities. The semiconductor device 10 is also constructed to permit the fast extraction, or removal, of energetic electrons following the reduction of voltage during any cycle of an applied oscillating voltage.

The semiconductor 10 is a heterojunction device which incorporates a main body portion 12 of a material such as a doped gallium arsenide. The semiconductor material may be doped to a density of 2 to $6 \times 10^{15}$ atoms/cm$^3$ to form an N-type material. One end of the semiconductor main body portion 12 is doped to produce a contact, or collector layer 14 which is a continuation of the material of layer 12, but heavily doped. Layer 14 serves to match the energy gap of the body portion 12 to a metal contact 16 without introducing a barrier therebetween. The layer 14 preferably is a heavily doped N+ type gallium arsenide semiconductor. The junction between the N-type main body portion 12 and the heavily doped N+ layer 14 is illustrated at 18.

The opposite end (the left hand end as viewed in FIG. 1) of the body portion 12 forms a junction with wide band gap semiconductor layer 20 which is a material having a different band gap than the material of main body portion 12. Thus, for example, the layer 20 may be formed from doped aluminum gallium arsenide (AlGaAs). The interface between layer 20 and a second metal electrode 22 is formed by a layer of N+ type gallium arsenide 24. The device as shown forms a diode, with electrode 22 the cathode and electrode 16 the anode.

The body portion 12 of the semiconductor device 10 is approximately 0.7 micron in thickness, extending between junction 18 and a junction 26 between the body portion 12 and layer 20, and forming a drift region for the semiconductor. The layer 20 may be about 0.1 micron in thickness and provides a thin barrier layer which serves as an injection region for launching ballistic electrons into the drift region 12. Electrons are injected from the cathode 22 into the drift region at a precisely controlled kinetic energy which is determined by the height of the barrier formed at the junction 26 between the injection region 20 and the drift region 12. The drift region has a low, controlled density of electrons and impurities, as determined by the doping level. This doping level should be greater than $1 \times 10^{15}$ atoms/cm$^3$ for good conductivity, but less than $1 \times 10^{16}$ atoms/cm$^3$ to prevent impurity collisions. The optimal doping level is in the $2-6 \times 10^{15}$ atoms/cm$^3$ range.

The doping level in the AlGaAs launching region 20 should be about 20 times that in the drift region 12 in order to allow the thermionic emission of electrons over the barrier to have the current density necessary to supply ballistic electrons at the same density as the doping ion density in the drift region.

A bias voltage source 28 is connected across semiconductor device 10, by way of electrode contacts 16 and 24. When a series LC circuit 30 is coupled across the device 10 and resonated with it, an oscillating voltage in the high microwave frequency range, which varies between about 0.4 volts and 1.6 volts, develops. A bias voltage of about 1.0 volt may be provided, yielding a peak microwave frequency voltage of about 0.6 V.

Figure 2:
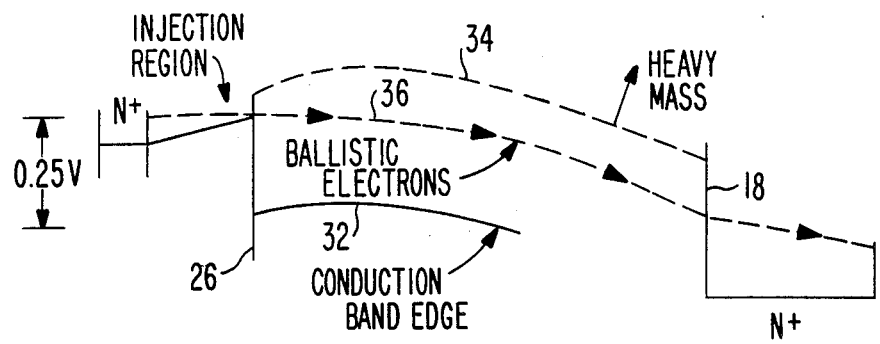
FIG. 2 is a diagrammatic illustration of the potential profile of the device of FIG. 1.

The potential profile of the device 10 is illustrated in FIG. 2, which shows, among other things, the variation in the conduction band edge 32 for the various layers in the device 10 under a low voltage (bias) condition. As illustrated, ballistic electrons are injected into the drift region 12 of the device 10 upon the application of a low voltage across the device 10, in the range of 0.4 V. A potential of this magnitude provides a field across the width of the semiconductor device which is sufficient to enable electrons to overcome the barrier at interface 26, which is illustrated in FIG. 2 as being about 0.25 volts, for injection into the drift region, but which is not sufficient to produce intervalley transitions of the charge carriers resulting from collisions with the crystal lattice of the body portion 12. The potential required to produce intervalley transitions within the body portion 12 is illstrated by the potential line 34. As illustrated, the energy level of the ballistic electrons, indicated by line 36, is insufficient to pass through the high mass energy level 34 before they reach the interface layer 14, under the low-voltage bias condition shown in FIG. 2.

Ballistic electrons in lightly doped gallium arsenide travel about 1500–1800 Angstroms, or about 0.15–0.18 micron, between collisions which result in the launching of longitudinal polar optical phonons, at 300° K. The average scattering angle at such collisions is about 10°, and this angle increases on the average as some function between the square root of the number of collisions and the number of collisions. Thus, in travelling in a region free of an applied electrical field, electrons will lose up to 0.144 volts energy and will be travelling 20°–40° from their original direction after a distance of 0.6 micron. Although an applied electric field of about 2000–2400 volts per centimeter will exactly keep up the electron energy, the angle will not be completely corrected. Thus, an electron can travel nearly ballistically through lightly doped gallium arsenide for only a limited distance. The diode 10 of the present invention is thin enough to enable the energetic electrons in the low mass condition to travel ballistically at $1 \times 10^8$ cm/second completely through the device to the farthest electrode 16 in about 0.8 picoseconds, during the application of a low voltage. This velocity can be maintained in lightly doped gallium arsenide for distances of up to nearly 1.0 micron in the presence of a small controlled electric field, with gradually rising doping to account for gradual electron velocity drop in longer devices.

Figure 3:
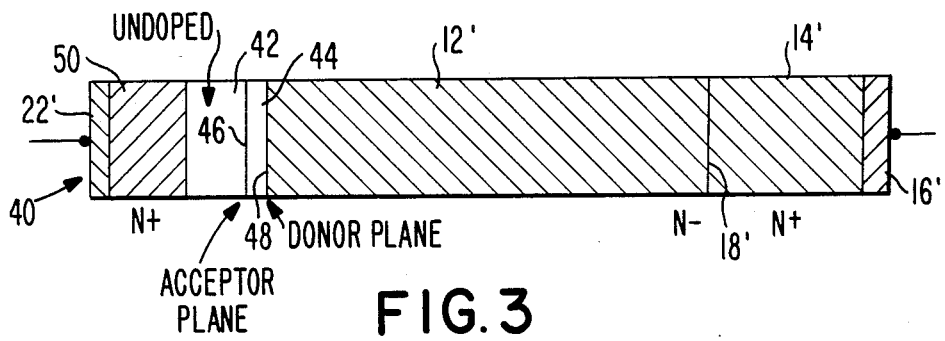
FIG. 3 is a diagrammatic illustration of a modified version of the device of FIG. 1, utilizing a planar doped barrier.

Similar results can be obtained in the semiconductor diode 40 illustrated in FIG. 3, which device utilizes a planar doped barrier instead of the heterojunction arrangement of FIG. 1. Thus, the device of FIG. 3 includes a body portion 12' which forms a drift region, an interface, heavily doped (N+) or collector layer 14' between the drift region and a metal contact 16' in the manner of the device FIG. 1. At the opposite end of the body portion 12' is formed an undoped layer 24 of gallium arsenide with an intermediate depletion region 44 defined therebetween, the depletion region extending between an acceptor plane 46 and a donor plan 48. The interface between the undoped layer 42 and the metal contact 22' is formed by a heavily doped (N+) region 50 of gallium arsenide.

Figure 4:
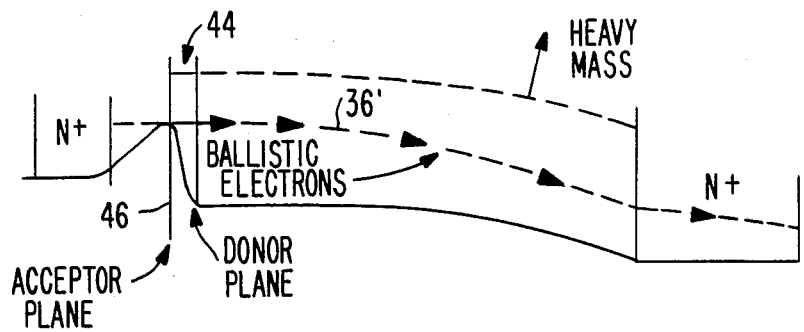
FIG. 4 is a diagrammatic illustration of the potential profile of the device of FIG. 3.

The potential profile for the device 40 of FIG. 3 is illustrated diagrammically in FIG. 4, and illustrates the formation of the potential barrier at the acceptor plane 46. This barrier serves to launch ballistic electrons 36' through the depletion region 44 into the drift region 12' in the manner discussed above with respect to FIG. 1.

A combination of the launching structures of FIGS. 1 and 3 is also possible, to provide complete control of the barrier in the device of FIG. 1. In such an arrangement an acceptor plane at or near the heterojunction between the AlGaAs layer 20 and the drift region 12 would be provided.

Another, less controlled, method of injection ballistic electrons into the drift region of a semiconductor body is to simply have the injection region formed as a layer of gallium arsenide free from any electrons or donors. This layer, which would be approximately 0.1 micron thick, would result in a voltage drop across the donor-free layer, accelerating electrons from the metal contact interface layer into and through the thin launching region. This arrangement would not permit the electrons to be launched with a nearly constant kinetic energy over a wide range of injected currents, since the current and voltage rise together across such a thin, space-charge limited region.

Figure 5:
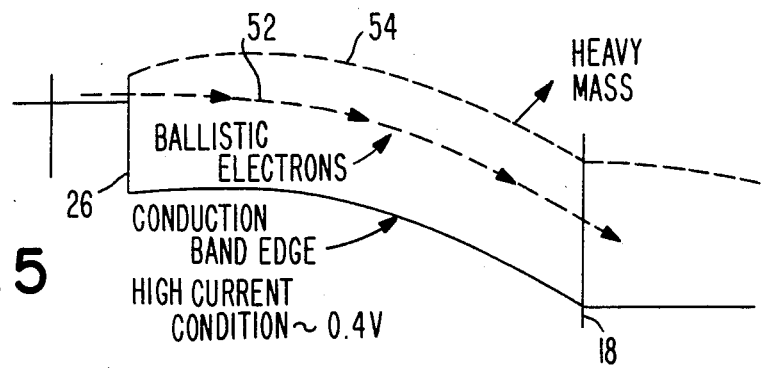
FIGS. 5 and 6 show low voltage and high voltage potential profiles, respectively, for the device of FIG. 1.

The diagrammatic potential profile of FIG. 2 illustrates the conditions within the semiconductor device 10 upon application of a low bias voltage. The diagram of FIG. 5 is similar to that of FIG. 2, showing the potential conditions within the device at a slightly higher voltage, but still below the applied voltage which is required to enable the injected electrons 52 to reach the 0.34 electron volt transfer energy illustrated by the dotted lines 54. As previously explained, if the injected electrons reach the level of the transfer energy, they are converted from ballistic, low mass electrons to a high mass condition, which slows them down. By keeping the electrons below the transfer energy level, the average electron velocity remains high, as previously explained.

Figure 6:
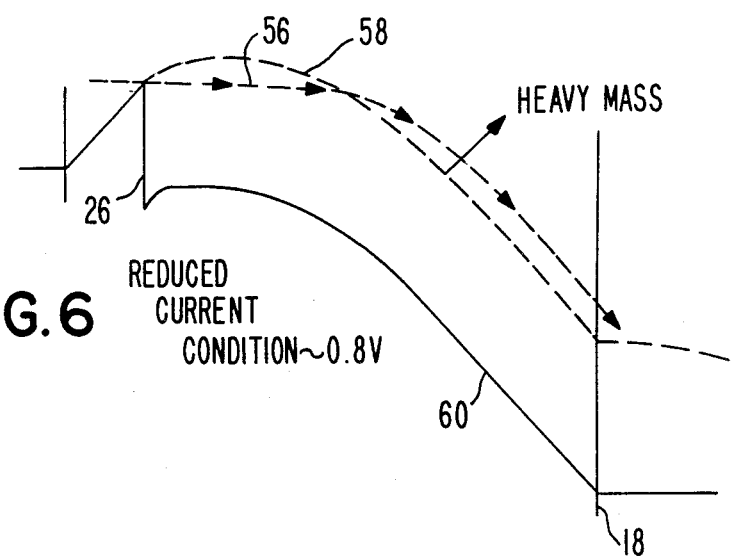

Upon application of a higher bias or potential voltage, the ballistic electrons quickly increase in energy and transfer to the high mass condition, as illustrated in FIG. 6. In this case, the ballistic electrons 56 cross the transfer energy line 58, which line has been moved with the bending of the conduction band edge 60 upon application of a higher voltage, and accordingly the electrons injected during the high voltage condition are slowed down drastically. These slowed electrons reach the right hand side of the drift region 12 (as viewed in FIG. 1) and since the junction area 18 has a space charge that is essentially neutral, the slowed electrons enter the layer 14 and travel to the metal contact 16. Since there must be current continuity within the device, the slowed electrons reaching the contact 16 force the current flow in the entire device to be slowed, thereby reducing the injection rate of ballistic electrons. The barrier is raised automatically by having less voltage in that region, thereby reducing current injection.

Figure 7:
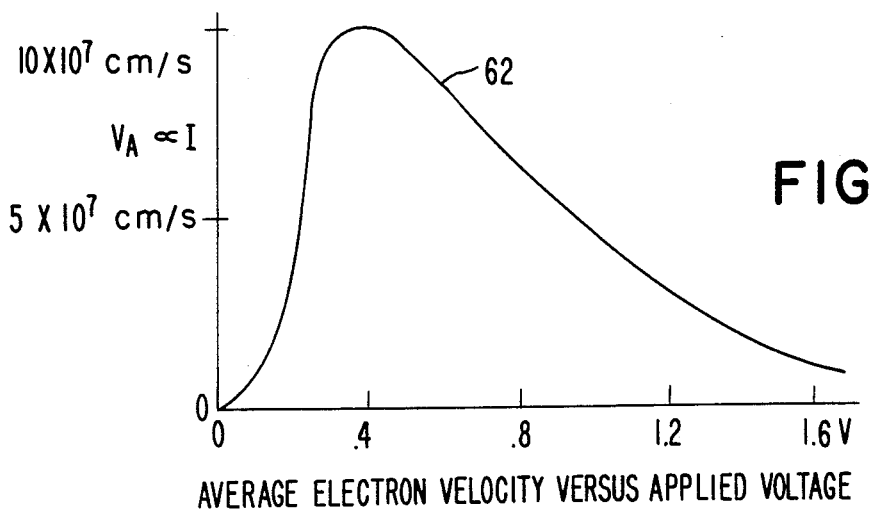
FIG. 7 is a graphical illustration of the average electron velocity versus the applied voltage of the devices of FIGS. 1 or 3.

The range of electron velocities within the drift region 12 which occurs with varying applied voltage conditions is illustrated in FIG. 7 by the curve 62. As illustrated, the electron velocity is high at low voltages, reaching a peak at about 0.4 volts, and declines rapidly as the voltage increases and more and more electrons are transferred to the heavy mass state earlier in their drift across region 12.

When an oscillating voltage is applied across the electrodes 16 and 22, a single cycle carries the voltage from a low value through a high value and back to a low value. When this occurs, energetic electrons which have been injected into the device 10 must either be cooled down or removed from the drift region to enable the current to accurately follow the voltage variations and to permit high frequency operation of the device. This cooling down allows the injection of a new set of ballistic electrons, all moving in the same direction at the same velocity, as the applied voltage returns to its low value. Since some of the electrons remain in the high mass state, and thus move more slowly, they place a restriction on the rate at which the current flow can change.

Although high mass electrons can transfer back to a lighter mass in about $1 \times 10^{-13}$ seconds, the higher state density in the heavy mass condition results in about 70% of the electrons remaining in that condition until lower mass electrons are extracted from the device. The lower mass electrons produced by the transfer back from the heavy mass condition have nearly equal probabilities of going in any direction and have about 0.28 eV energy. Those returned electrons can travel toward either contact electrode; those travelling toward electrode 22 can reach it if they are able to go over the launching barrier. However, due to the finite, but small, electric field that exists across the region 12 even in the low voltage state, most of the electrons will travel toward the anode electrode 16.

In an ordinary transferred electron device, the frequency response depends upon the combined rate of electron transfer back from the high electron mass condition and the rate of electron energy relaxation. This relaxation time is effectively about 7 picoseconds for ordinary transferred electron devices using gallium arsenide, where 70% of the electrons are in the high electron mass condition and 30% are in the low electron mass condition during the high voltage portion of the oscillating cycle. This effective time results from an energy relaxation time of 2.1 picoseconds for low mass electrons, which constitute only 30% of the total current carrying electrons, so the effective relaxation time for such devices is $2.1/0.3 = 7.0$ picoseconds.

However, the use of ballistic electrons which can travel at $1 \times 10^8$ cm/s to even the furthest electrode in the present device enables the electrons to travel through the device in about 0.8 picoseconds. This results in an effective relaxation time for the device of $0.8/0.30 = 2.67$ picoseconds, rather than the 7.0 picoseconds of usual transferred electron devices. This permits the frequency response of the present device to be raised by as much as about $2\frac{1}{2}$ times that of prior devices, so that instead of having the efficiency of the device halved at 50 gHz, as in an ordinary device, it will be halved at only about 125 gHz.

The increase in efficiency is based on the fact that the efficiency of oscillation of transferred electron devices depends on the ratio of peak electron current to valley electron current, and that in turn depends on the ratio of peak velocity of the average electrons to the valley velocity of the average electrons; therefore, efficiency is substantially increased in the device of the present invention. The approximate increase in efficiency is also as much as 2.5 times that of ordinary transferred electron devices, thus increasing the efficiency from about 16% to about 40%.

Thus there has been disclosed an improved semiconductor diode device capable of higher frequencies of response and improved efficiency of operation. Although the present invention has been described in terms of a preferred embodiment thereof, various modifications will be apparent to those of skill in the art. Accordingly, the true spirit and scope of the invention is limited only by the following claims.

What is claimed is:

1. A high frequency transferred electron device having electron ballistic injection and extraction for very high efficiency, comprising:
   a semiconductor body portion;
   a first electrode;
   a ballistic injection region connecting said first electrode to a first end of said body portion, said region including a potential barrier for injecting electrons into said body portion at an energy level sufficiently high to enable the electrons to traverse said body portion ballistically;
   a second electrode portion;
   a collector semiconductor region connecting said second electrode portion to a second end of said body portion, the connection between the second end of said body portion and said collector semiconductor region being free of any potential barrier; and
   means for applying a high frequency varying potential across said electrodes to cause injection of ballistic electrons into said body portions, said applied potential varying between a low applied potential value which causes very high peak electron velocity and results in ballistic travel across said body portion and a high applied potential value which causes a transfer of injected ballistic electrons to a high mass condition for travel at a low velocity across said body portion, the potential variation producing a high efficiency ratio between the peak velocity of average electrons and the valley velocity of average electrons.

2. The device of claim 1, wherein said means for applying a high frequency potential comprises a bias voltage and resonant LC circuit means producing a self-oscillating voltage across said electrode.

3. The device of claim 1, wherein said collector semiconductor region is heavily doped to form a substantially neutral space charge in its connection to said body portion to remove ballistic electrons from said device by way of said second electrode.

4. The device of claim 3, wherein said ballistic injection region comprises a material having a different energy band than that of said body portion.

5. The device of claim 3, wherein said ballistic injection region and said body portion interface at a heterojunction between dissimilar semiconductor materials to form a barrier for launching ballistic electrons into said body portion over a fixed potential step.

6. The device of claim 3, wherein said ballistic injection region and said body portion interface to form a planar doped barrier for launching ballistic electrons into said body portion over a nearly fixed potential step.

7. The device of claim 1, wherein said body portion has a thickness of about 0.7 micron and said injection region has a thickness of about 0.1 micron.

8. The device of claim 7, wherein said body portion is a doped N− type GaAs material.

9. The device of claim 8, wherein said collector semiconductor region is an N+ type GaAs region.

10. The device of claim 7, wherein said body portion is a lightly-doped semiconductor material having a low, controlled density of electrons and impurities.

11. The device of claim 10, wherein said material is GaAs, doped to a level of $2-6 \times 10^{15}$ atoms/cm$^3$.

12. The device of claim 10, wherein said injection region comprises a layer of AlGaAs doped at about twenty times the level of doping of said body portion to produce a barrier at the junction between said main body portion and said injection region.

13. The device of claim 10, wherein said injection region comprises a layer of undoped GaAs forming a depletion region at the interface between said main body portion and said injection region, said depletion region forming a barrier for launching ballistic electrons.

14. The device of claim 10, wherein said collector semiconductor region is an N+ type GaAs region.

15. The device of claim 7, wherein said means for applying a varying potential across said electrodes includes a source of bias potential and an LC circuit comprising an inductor capacitively coupled across and resonant with said transferred electron device, said LC circuit being self-oscillating at a high frequency at a total voltage across said electrodes which varies between about 0.4 V and about 1.6 V.

16. A method for providing a transferred electron device with improved high frequency response and increased efficiency, comprising:
   forming a semiconductor body portion having a low, controlled density of electrons and impurities to provide a semiconductor drift region;
   forming at one end of said body portion a collector semiconductor region having a substantially neutral space charge for connecting said body portion to an anode electrode, without a potential barrier;
   forming at the opposite end of said body portion a ballistic injection region connecting said body portion to a cathode electrode and forming a barrier between said body portion and said injection region;
   applying a high frequency potential across said electrodes, said potential varying between a low value for launching ballistic electrons over said barrier and into said drift region at a high velocity substantially without causing intervalley transitions so that injected electrons retain a low mass condition and high velocity across the entire width of said body portion, and a high value for launching ballistic electrons over said barrier and into said drift region with an energy level sufficient to cause transfer of electrons to a high mass condition, said high mass electrons returning to a low mass condition when said applied potential returns to a low value, said electrons being extracted from said body portion through said collector semiconductor region.

* * * * *